United States Patent [19]
Hawkins et al.

[11] Patent Number: 5,083,100
[45] Date of Patent: Jan. 21, 1992

[54] ELECTRONICALLY VARIABLE DELAY LINE

[75] Inventors: Thomas B. Hawkins, Boylston; Douglas A. MacIntyre, Medway, both of Mass.; Johannes A. S. Bjorner, Woodbury, Conn.

[73] Assignee: Digital Equipment Corporation, Maynard, Mass.

[21] Appl. No.: 662,383

[22] Filed: Feb. 26, 1991

Related U.S. Application Data

[63] Continuation of Ser. No. 464,825, Jan. 16, 1990, abandoned.

[51] Int. Cl.$^5$ .......................... H03H 7/20; H03H 7/38
[52] U.S. Cl. ........................................ 333/164; 333/32; 333/139
[58] Field of Search ............................... 333/138–140, 333/156, 161, 164, 33, 32

[56] References Cited

U.S. PATENT DOCUMENTS

| | | | |
|---|---|---|---|
| 3,177,433 | 4/1965 | Simon et al. | 333/139 X |
| 3,246,265 | 4/1966 | Smith-Vaniz | 333/164 X |
| 3,748,499 | 7/1973 | Schaffner | 333/140 X |
| 3,750,055 | 7/1973 | Funck | 333/161 |
| 3,882,431 | 5/1975 | Hopwood et al. | 333/139 |
| 3,911,382 | 10/1975 | Harth et al. | 333/164 X |
| 4,604,591 | 8/1986 | Vasile | 333/164 X |
| 4,837,532 | 6/1989 | Lang | 333/164 |

Primary Examiner—Eugene R. LaRoche
Assistant Examiner—Seung Ham
Attorney, Agent, or Firm—Cesari & McKenna

[57] ABSTRACT

An electronically variable delay line having adjustable delay and bandwidth characteristics is provided. A varactor diode functioning as a variable controlled capacitance is coupled between a signal conductor and a ground reference conductor, thereby segmenting the signal conductor into two, individual smaller segments of conductor which function as fixed inductances. The delay characteristic of the line is adjusted by varying the varactor's biasing voltage which, in turn, varies the varactor's capacitance. A staggered termination technique is implemented to stabilize the insertion loss characteristics of the delay line.

13 Claims, 6 Drawing Sheets

ELECTRONICALLY VARIABLE DELAY LINE

This is a continuation of application Ser. No. 07/464,825, filed on Jan. 16, 1990, now abandoned.

FIELD OF THE INVENTION

The invention relates to a method and apparatus for dynamically varying the delay in a transmission line and, more specifically, to an electronically adjustable delay line exhibiting broad bandwidth and stable insertion loss characteristics.

BACKGROUND OF THE INVENTION

Modern high performance synchronous computer systems typically require two clock signals to create timing signals for enabling various state devices within the computer. One of the clock signals (Master) operates at a higher frequency than the other clock signal (Ref), with the Master clock signal shaping the timing signals or sub-phases of the Ref clock signal. In order to create the sub-phase timing signals, it is necessary that the Master and Ref clock signals be aligned or synchronized. However, skew and propagation delays can complicate such synchronization.

Skew, which can be defined as the settling of voltage levels to final values at different times due to differences in the electrical characteristics of state devices and transmission lines, can cause timing errors since the Master and Ref clock signals which are transmitted close together but in a defined sequence, may arrive in an unpredictable sequence at a state device. As a result, there is a need to change certain characteristics of the transmission line used for propagation of the clock signals to synchronize the signals and compensate for the potential range of skew present in the computer system.

A clock signal propagates as a wave from a transmitter to a receiver or state device along a transmission line. The time necessary for the wave to travel along the line is called the propagation time ($t_{pd}$). The propagation speed ($v_p$) of the wave/signal can be expressed in terms of the distance (d) traveled by the signal divided by the propagation time $t_{pd}$:

$$v_p = (d/t_{pd})$$

The propagation speed $v_p$ is a physical property of the transmission line and may be indicated in the form of a propagation delay ($t_d$), which is the inverse of the propagation speed $v_p$. The propagation delay $t_d$ of a transmission line can be simply expressed in terms of the inductive and capacitive elements of the line:

$$t_d = sqrt\ (L * C)$$

Attempts to change the propagation characteristics of transmission lines have resulted in changing the delay characteristics of the line. Conventional delay line technology, or more specifically delay line circuits, typically resemble a lumped model, otherwise known as a ladder network. The ladder network may consist of fixed lumped elements such as inductors, capacitors, and resistors whose values cannot be dynamically altered to compensate for the required range of delay. Other topologies, for example lattice networks, are entirely differential in nature and require transformer coupling which is expensive and often band-limiting. Most of the circuit elements used in the lumped design have parasitic losses or resonances, thereby precluding their use over certain frequency ranges.

Changes to either the capacitive or inductive elements of a transmission line will therefore alter the line's delay characteristics. In order to compensate for the potential range of skew present in the computer system, there is the need to dynamically vary the capacitance or inductance of the line. But, changes to the inductance or capacitance will, in turn, cause a change in the characteristic impedance of the transmission line.

The ratio of voltage to current in a clock signal traveling along a transmission line is called the characteristic impedance $Z_o$ of the line. The characteristic impedance $Z_o$ is also a physical property of the transmission line, that is, it depends upon the line's dielectric properties and capacitive load and, as such, can be expressed in terms of the inductive and capacitive elements of the line:

$$Z_o = sqrt\ (L/C)$$

Conventional delay lines are typically low-pass filter circuits configured as ladder networks. These networks are typically terminated with matching resistances at the ends of the delay line. In other words, the line is terminated by a matched pair of resistances whose value is approximately equal to the characteristic impedance of the line, so that signals reaching the end of the line are absorbed, thereby reducing reflections. Proper termination of the transmission line also minimizes variations in insertion loss of the line or, in other words, maintains a constant amplitude level of the signals. As the characteristic impedance $Z_o$ of the conventional delay line varies, a mismatch with the termination resistance of the line is likely, resulting in reflections of the signals propagating the line which could cause the false triggering of state devices.

Therefore, in accordance with an aspect of the present invention, a feature is to provide a range of variable insertion delay over a wide band of high frequencies in order to synchronize two clock signals originating from signal paths that have unknown and differing skew.

Additionally, a feature of the present invention is to provide a low-cost variable delay line configuration having electronically adjustable delay that exhibits broad bandwidth and stable insertion loss characteristics.

In accordance with another aspect of the invention, a feature is to provide an improved termination technique for a variable delay line that utilizes a pair of impedance optimizing resistances, resulting in improved insertion loss stability and a multi-decade bandwidth characteristic over a frequency range of kilohertz to gigahertz.

A further feature of the present invention is to provide an electronically variable delay line that utilizes components which are less expensive than available vendor supplied devices which do not have the broad frequency range and other characteristics exhibited by this invention.

SUMMARY OF THE INVENTION

The foregoing and other features of the invention are accomplished by providing an electronically variable delay line having adjustable delay and bandwidth characteristics. In general, a varactor diode functioning as a variable controlled capacitance is coupled between a signal conductor and a ground reference conductor, thereby segmenting the signal conductor into two, individual smaller segments of conductor which function as fixed inductances. The delay of the line is adjusted by varying the varactor's biasing voltage which, in turn, varies the varactor's capacitance. A staggered termination technique is implemented to stabilize the insertion loss characteristics of the delay line.

Other objects, features and advantages of the invention will become apparent from a reading of the specification when taken in conjunction with the drawings, in which like reference numerals refer to like elements in the several views.

DESCRIPTION OF THE PREFERRED EMBODIMENTS

Figure 1:
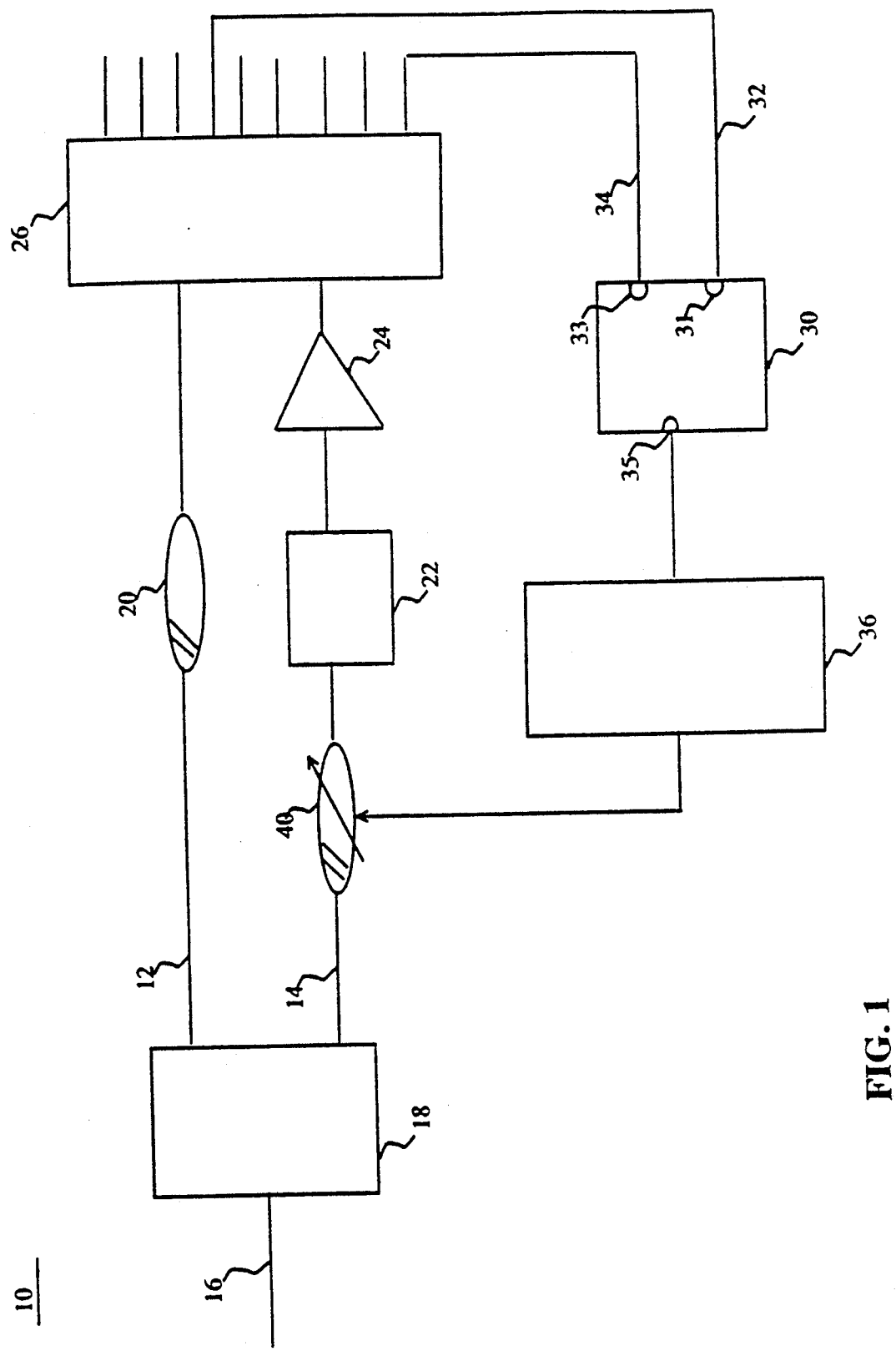
FIG. 1 shows a block diagram of a typical application of an electronically variable delay line apparatus according to the invention.

Referring to the drawings, and particularly to FIG. 1, there is shown a block diagram of portions of a clock module 10 used in a high performance synchronous computer which embodies the present invention. The clock module 10 is formed of a circuit board consisting of an insulative substrate material having conductive lamina on two, major opposite surfaces thereof, with selected portions of the conductive lamina removed to define conductive, etched signal paths assembled to the two major surfaces. Clock module 10 may also have numerous internal conductive and non-conductive layers sandwiched between the outer, opposite surfaces. Two etched signal paths of clock module 10 are depicted in FIG. 1 and have been designated generally by the reference numerals 12,14.

Signal paths 12,14 are transmission lines of the type conventionally utilized in computer systems, that is, signal paths 12,14 are etched, microstrip lines in a circuit board with respect to a ground plane. In accordance with this particular embodiment of the invention, signal paths 12,14 originate from a signal path 16, the signal path 16 being separated by a coupler 18, which is preferably a voltage divider network. For the purpose of defining the nomenclature used to describe the present invention, signal path 12 is called the Master clock line and signal path 14 is called the Ref clock line.

The Master clock line 12 is used for propagation of Master clock signals and has an associated fixed delay element 20. The fixed delay element 20 is a physical property of the line 12, that is, the fixed delay 20 is dependent upon the inductive and capacitive characteristics of the line 12. The Ref clock line 14 is likewise used for propagation of Ref clock signals, which in this particular embodiment is one-eighth the frequency of the Master clock signal, and has an associated variable delay element or delay line 40. In accordance with the principles of the present invention, the variable delay line 40 may be electronically adjusted to compensate for skew present between the Master clock line 12 and the Ref clock line 14.

Located along the Ref clock line 14 are a divider circuit 22 and an amplifier circuit 24. The divider circuit 22 functions as a frequency divider, that is, it divides an original signal into fractions of the original signal. For this particular embodiment, the divider circuit 22 includes a plurality of state devices, such as flip-flops, which effectively divides the Master clock signal by eight to produce the Ref clock signal. Thereafter, the amplifier circuit 24, which is preferably an radio frequency (RF) amplifier, increases the signal level of the resulting Ref clock.

The Master clock line 12 and Ref clock line 14, as output from amplifier 24, are connected to power divide circuit 26, which creates multiple copies of the respective clock signals. Two copies of the clock signals are sampled and fed to a phase detector circuit 30. One of the copies, designated by line 32 is a copy of the Master clock; the other copy is designated by line 34 and is a copy of the Ref clock signal.

The phase detector circuit 30 is preferably a high speed ECL, D-type flip-flop which detects and compares the phase or relative position of the rising edges of the two clock signals. It is to be understood that the phase detector 30 is capable of comparing the phase of two clock signals having different frequencies, in addition to comparing clock signals of the same frequency. The Master clock copy line 32 is coupled to the data input 31 of the flip-flop and the Ref clock copy line 34 is coupled to the clocking input 33. The output 35 of the flip-flop is coupled to an input of a synchronizing circuit 36, which preferably consists of a counter, a D/A converter, and an operational amplifier in a connected topology. The output of the synchronizing circuit 36 is then fed back to the variable delay line 40.

In accordance with the invention, application of the electronically variable delay line apparatus to provide a range of delay in order to synchronize two clock signals originating from signal paths that have unknown and differing skew is as follows. A clock signal propagates, preferably at the Master clock frequency, as a wave along the Master clock line 12 and arrives at the power divide circuit 26 at a time and phase $t_{d1}$. Meanwhile, a similar clock signal propagates along the Ref clock line 14 to the divider circuit 22, where it is divided down to the Ref clock signal, then to the amplifier circuit 24, where the amplitude of the signal is increased, and then to the power divide circuit 26 where it arrives at a time and phase $t_{d2}$. As mentioned, the power divide circuit 26 creates multiple copies of the Master and Ref clock signals for distribution to other modules and subsystems within the computer system. One copy of each signal is compared by the phase detector 30, that is, the phase detector 30 looks at the difference in phase $t_{d2}-t_{d1}$ between the Master and Ref clock signals and provides phase error information to the synchronizing circuit 36. The phase detector 30 detects and updates the error information preferably at a sample rate of approximately 1 KHz. The error information is determined by the state of the output of the detector 30; if the output is "high", less delay is required and if the output is "low", more delay is needed. This error information is fed to an up/down counter, whose output is coupled to a feedback amplifier via a digital-to-analog converter. The op-amp then provides the necessary biasing voltage to the variable delay line 40 to compensate for misalignment. The electronically variable delay line apparatus continues to adjust the voltage on the variable delay line 40 in the proper direction until there is no longer any net error information coming out of the phase detector 30, at which time the biasing voltage remains constant.

Figure 2:
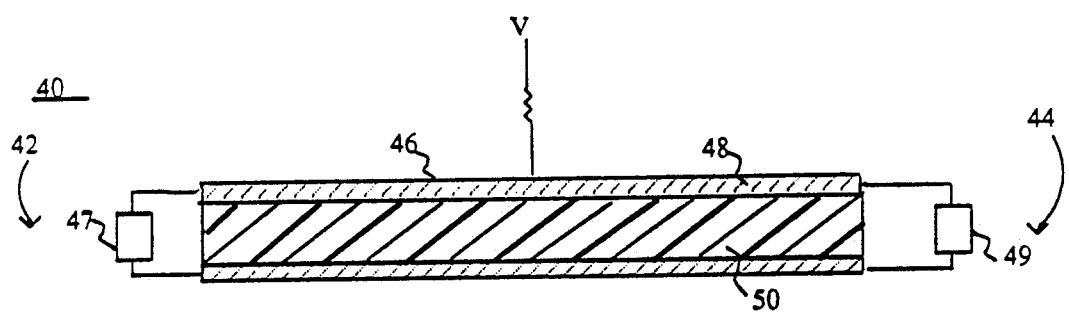
FIG. 2 is a block diagram of the electronically variable delay line used in the application of FIG. 1.

Referring now to FIG. 2, a block diagram of the electronically variable delay line 40 is illustrated. In accordance with the present invention, the electronically variable delay line 40, which may be implemented on a single integrated circuit chip, has an input end 42 and output end 44, and includes a conducting path 46 having a capacitive element 50 and an inherent inductive element 48. The electronically variable delay line 40 also includes resistive elements 47,49 for terminating the delay line 40.

In accordance with the teachings set forth herein, the variable delay line 40 improves conventional delay line technology by coupling varactor diodes, functioning as voltage controlled variable capacitances, to a printed circuit (PC) signal conductor such that the PC conductor is segmented and functions as several individual inductances. Thereafter, the delay of the variable delay line 40 may be adjusted within a predetermined range by changing the varactors' biasing voltage V, as previously described. Additionally, the variable delay line 40 improves conventional delay line termination techniques by inserting staggered input and output resistive loads which minimize reflections and stabilizes insertion loss throughout the delay range.

Figure 3:
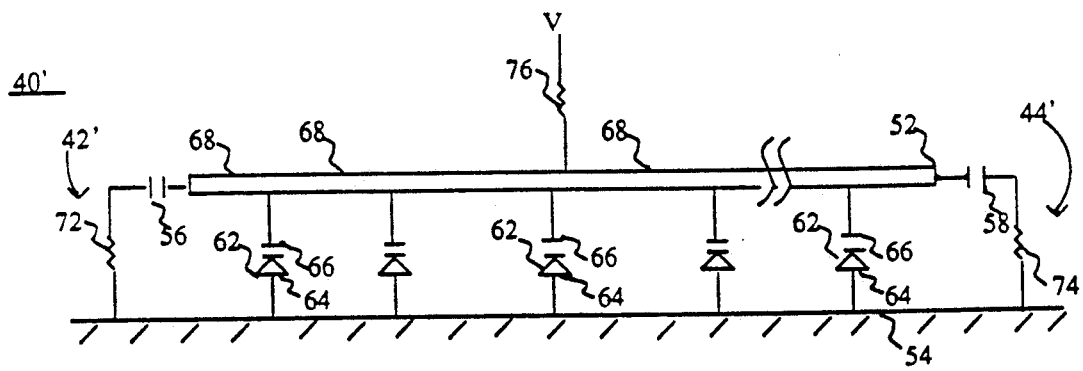
FIG. 3 is a circuit schematic of an embodiment of the electronically variable delay line of FIG. 2.

Referring also to FIG. 3, a discrete circuit schematic of an embodiment of the electronically variable delay line 40' is illustrated. The conducting path of the delay line 40' includes a PC signal conductor 52 and a ground reference conductor 54. In a preferred embodiment of the invention, the PC signal conductor 52 is a copper microstrip line conductor etched on a multilayer circuit board having a thickness of 0.020 inches and the ground reference conductor 54 is a ground plane located within the multilayer circuit board, with the distance between the PC conductor 52 and the ground conductor 54 being approximately 0.080 inches. The PC conductor 52 is also isolated from an AC signal applied to the input 42' and output 44' ends of the delay line 40' by capacitors 56,58.

The capacitive element of delay line 40' includes a varactor diode 62, the varactor 62 having an anode 64 and a cathode 66. The varactor 62 is mounted to the circuit board and connected to the delay line 40' in a configuration such that the cathode 66 of the varactor 62 is coupled to the PC signal conductor 52, while the anode 64 is coupled to the ground conductor 54. A plurality of substantially identical varactors 62 are preferably utilized, with the varactors 62 being connected at points equally distributed along the PC conductor 52, creating a plurality of segments 68.

Figure 4:
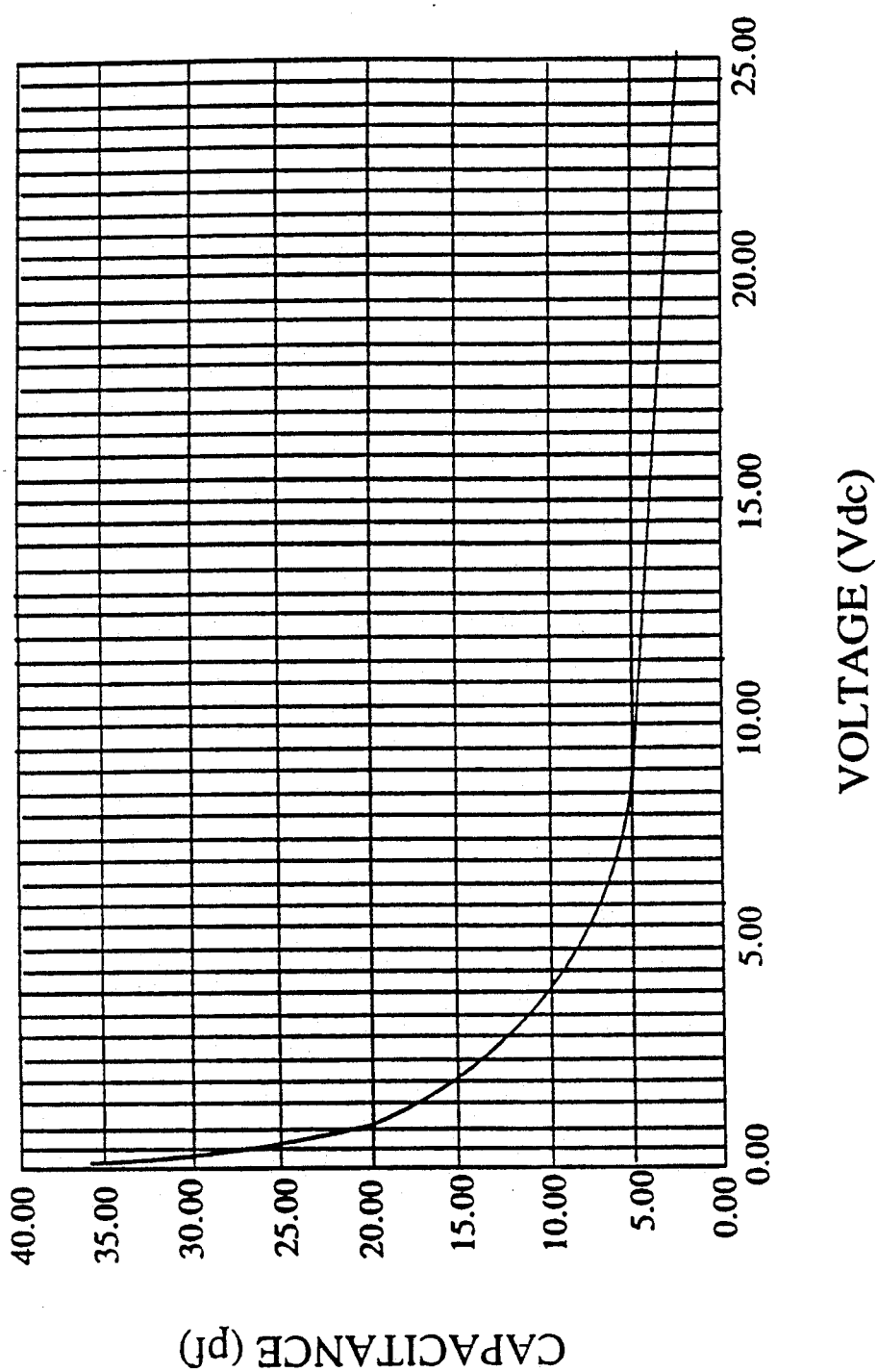
FIG. 4 graphically illustrates the voltage-variable capacitance characteristics of a varactor diode used in the electronically variable delay line of FIG. 3.

In accordance with the principles of the invention, the varactors 62 are used as electronically controlled capacitors. FIG. 4 depicts the voltage-variable capacitance characteristics of a typical varactor diode 62, such as a Philips/Amperex Hyperabrupt Tuning Varactor, used in the variable delay line 40'. It can be seen that as the applied voltage across the varactor 62 increases, its capacitance decreases. Since the delay element of a transmission line is dependent upon the capacitance of the line, use of the varactors 62 to alter the capacitance will cause changes to the delay characteristics of the line. However, a consequence of using varactors 62 to create a variable delay line 40' is that as the capacitance of the line 40' varies, the characteristic impedance of the variable delay line 40' also changes.

Referring back to FIGS. 2 and 3, the inductive element of delay line 40' includes a segment 68, the segment 68 consisting of an individual, smaller length of the copper PC signal conductor 52. A plurality of segments 68 functioning as a set of fixed inductances are preferably utilized, with the created segments 68 being equal to the varactors 62 coupled to the PC conductor 52 plus one; that is, the relationship of segments 68 to varactors 62 may be expressed as:

the number of segments = number of varactors + 1.

Figure 5:
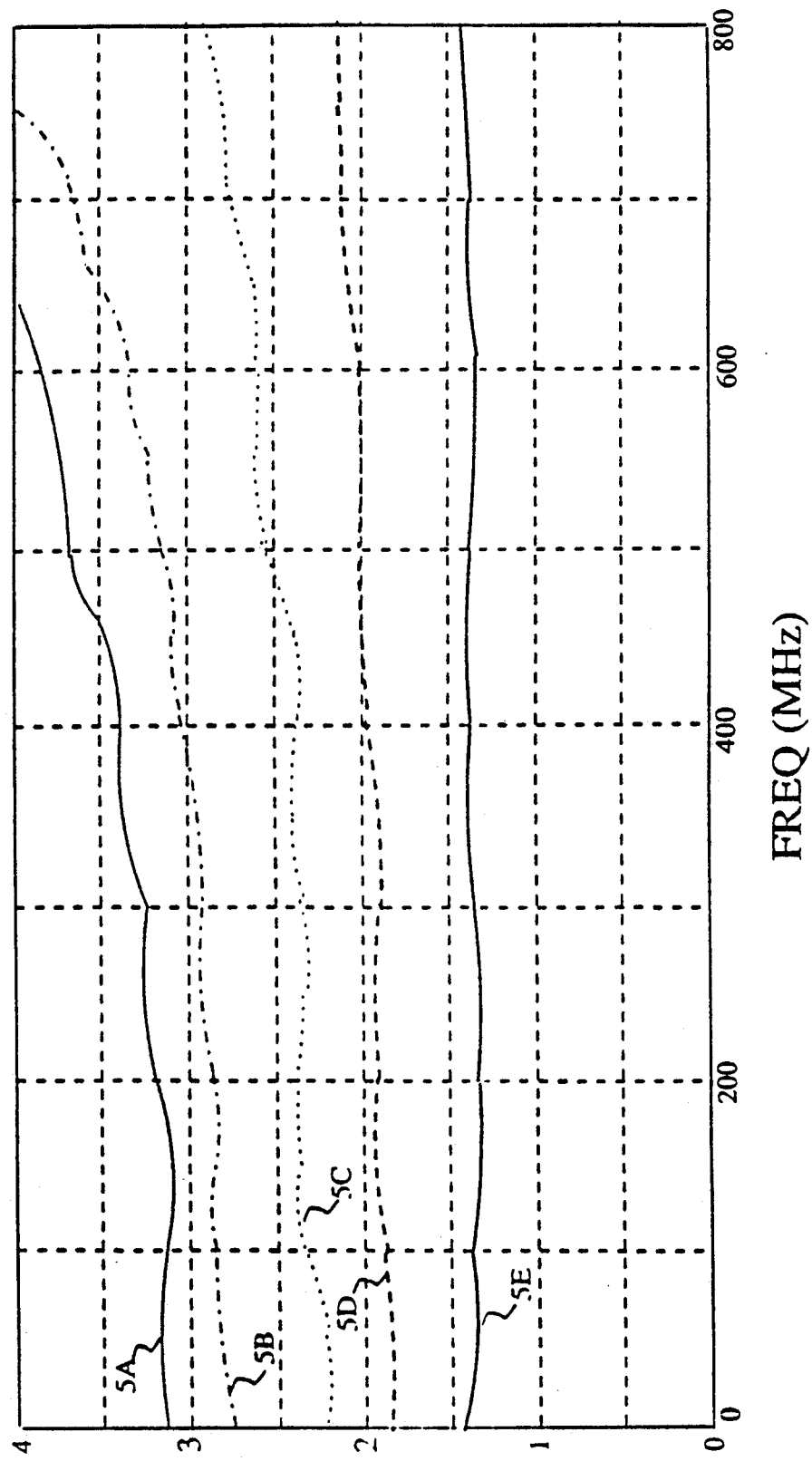
FIG. 5 graphically depicts the delay response of the electronically variable delay line of FIG. 3.

An advantage of the present invention involves the ability to select any number of varactors 62 for the delay line 40' depending upon the particular application. In a preferred embodiment of the invention, eight varactors 62 are used with the spacing between varactors 62, or the length of the segments 68, being approximately 0.75 inches. FIG. 5 shows the delay response of such an embodiment of the electronically variable delay line 40'. Graphs 5A-5E illustrate delay response curves at varactor biasing voltages of 2.5 v, 3.0 v, 5.0 v, 9.0 v, and 25.0 v, respectively, resulting in an absolute delay range equal to approximately 2-4 nanoseconds for a frequency range of up to 800 MHz. Of course, certain design parameters will vary depending upon the application, frequency range, and delay range desired. For example, if the required bandwidth of signals is low and a larger delay range is needed, a larger spacing between varactors 62 may be required. Nevertheless, the number of varactors 62 that may be used can vary from 1 to "infinity", leading to the generation of a solid-state equivalent of a continuously distributed delay line exhibiting improved insertion loss characteristics.

Referring again to FIGS. 2 and 3, the resistive elements of delay line 40' includes an input resistance 72 and an output resistance 74 shunted across the ends of delay line 40'. In other words, the input resistance 72 and output resistance 74 are coupled between the PC signal conductor 52 and the ground reference conductor 54 at the input 42' and output 44' ends of the delay line 40', respectively.

Figure 6:
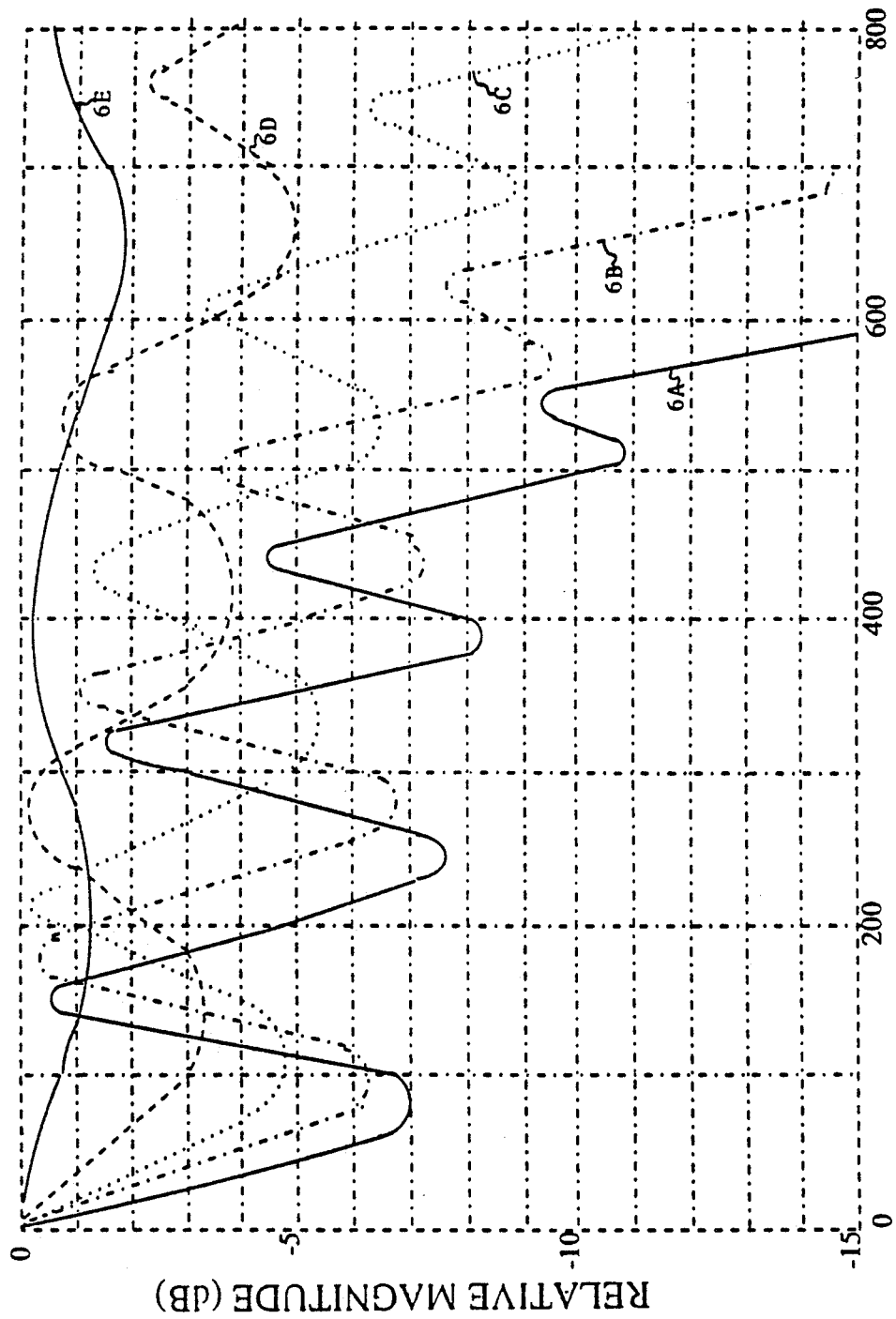
FIG. 6 graphically illustrates the relative magnitude response of the electronically variable delay line of FIG. 3 using non-staggered termination.

As previously mentioned, a consequence of using varactors to create a variable delay line is that as the capacitance of the line varies, the characteristic impedance of the line also changes, which in turn, would typically create a mismatch with the line's termination resistances. For example, assume that a variable delay line is tuned to a characteristic impedance of 50 ohms and the line is terminated with "matched" 50 ohm resistors at each end. As the capacitance of the line varies resulting in high delay characteristics, the characteristic impedance of the line changes to approximately 25 ohms. Conversely, as the capacitance varies resulting in low delay, the characteristic impedance changes to approximately 100 ohms. At 100 ohms or 25 ohms, there is a 2:1 mismatch between the instantaneous characteristic impedance of the line and the termination resistors on either end of the line. FIG. 6 illustrates the relative magnitude response curves 6A-6E of the electronically variable delay line 40' at varactor biasing voltages of 2.5 v, 3.0 v, 5.0 v, 9.0 v, and 25.0 v, respectively, using matched termination resistors when the characteristic impedance of the line is approximately 100 ohms. It can be seen that the signal propagating towards the end of the delay line 40' is not significantly absorbed, resulting in large reflections or ripple.

In accordance with the teachings set forth herein, an improved termination technique for the variable delay line 40' is provided, the termination technique including staggered, impedance optimizing input and output resistances, generally designated by reference numerals 72, 74, respectively. The values of the input resistance 72 and the output resistance 74 are chosen such that one of the resistances has a value that is low in comparison to the characteristic impedance of the delay line 40', while the other resistance has a value that is high relative to the characteristic impedance. In a preferred embodiment of the invention, the resistances 72, 74 are implemented as discrete resistors, with the precise ratio between the two resistors determined by the following algorithm:

$$Z_{opt1} = (sqrt(Z_{nom}/Z_{min}))*Z_{nom}$$

$$Z_{opt2} = (sqrt(Z_{nom}/Z_{max}))*Z_{nom}$$

where $Z_{nom}$ is the nominal impedance of the variable delay line 40', $Z_{min}$ is the minimum impedance of the delay line 40', and $Z_{max}$ is the maximum impedance of the delay line 40'. For the preferred embodiment, $Z_{nom}$ of the variable delay line 40' is approximately 50 ohms, $Z_{min}$ is approximately 25 ohms, and $Z_{max}$ is approximately 100 ohms. Since the ratio $Z_{nom}$ to $Z_{min}$ is a factor of two and the ratio $Z_{nom}$ to $Z_{max}$ is one-half, the value of one of the resistors is approximately 70 ohms, while the value of the other resistor is approximately 35 ohms. The reason for such widely different resistance values is to provide a near-match, mid-band staggered termination technique. At the high and low end of the frequency range, there would be essentially a single-reflection at either the input end 42' or the output end 44' of the delay line 40', with the reflection being absorbed at the other end, thus producing a satisfactory signal transfer response, even if not absolutely perfect. The characteristic impedance of the electronically variable delay line 40' according to the invention varies as the frequency is tuned, and is therefore somewhere in the range of 25 to 100 ohms. Accordingly, there will always be some marginal mismatch as the impedance of the delay line 40' changes, resulting in some reflection most of the time; however, the reflections are minimal most of the time.

Figure 7:
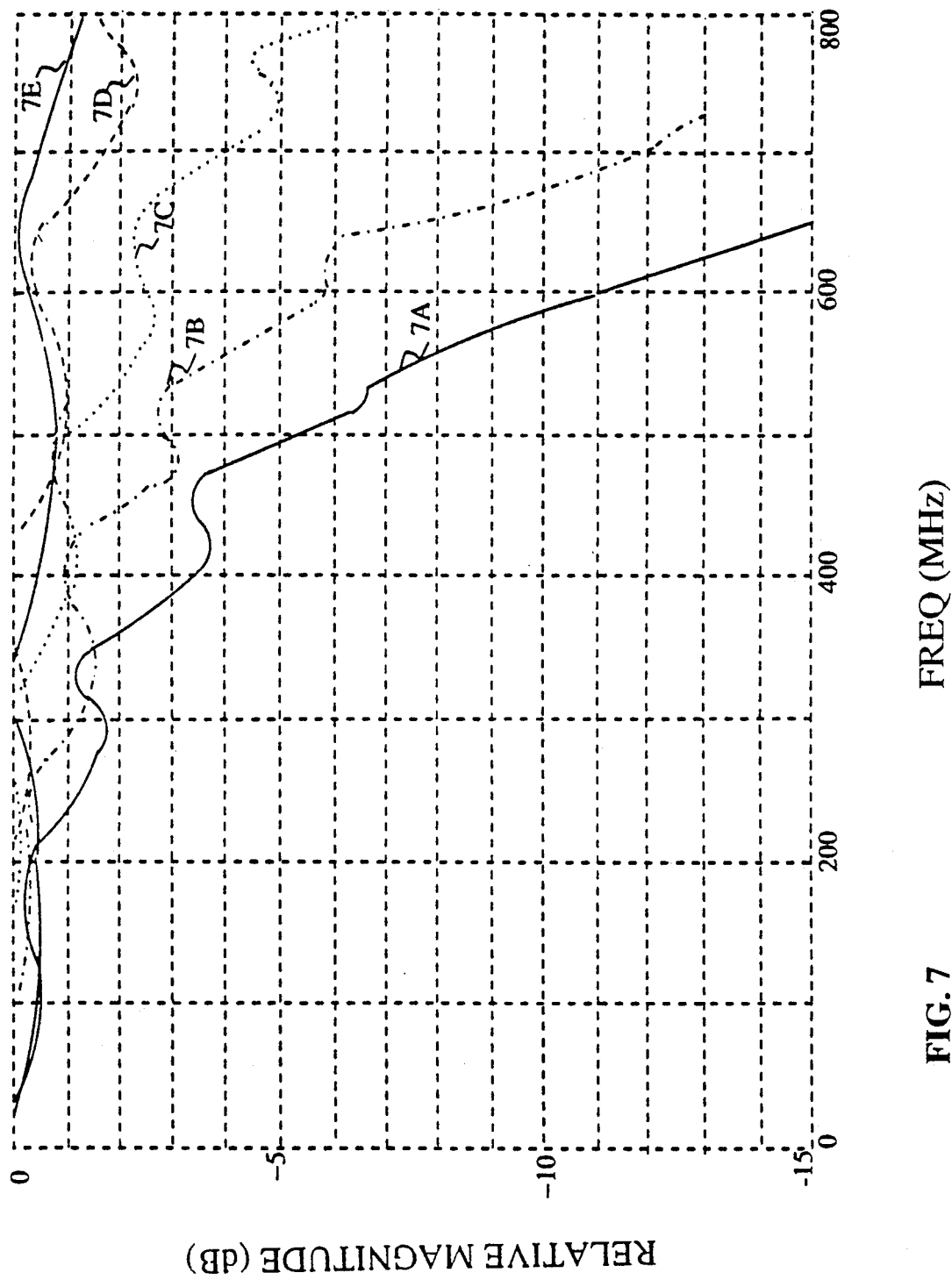
FIG. 7 graphically shows the relative magnitude response of the electronically variable delay line of FIG. 3 using a staggered termination technique in accordance with the invention.

In accordance with the teachings herein, the staggered relationship between the input resistor 72 and the output resistor 74, when interacting with the instantaneous characteristic impedance of the electronically variable delay line 40', results in input and output loads that minimize reflections. FIG. 7 shows the relative magnitude response curves 7A-7E at varactor biasing voltages of 2.5 v, 3.0 v, 5.0 v, 9.0 v, and 25.0 v, respectively, of the preferred embodiment of the variable delay line 40'. It can be seen that the staggered termination technique according to the invention stabilizes insertion loss and maintains the signal response within an amplitude range of ±2 decibels (dB).

As mentioned previously and referring back to FIGS. 3 and 4, the delay characteristic of the variable delay line 40' may be adjusted within a predetermined range by changing the varactor biasing voltage V. However, the combined delay line (AC) signal and varactor biasing voltage V should not exceed the upper or lower limits of the varactor 62 operating range, otherwise the varactor 62 would be biased incorrectly. Additionally, the value of the varactor tuning voltage resistance 76 should be large with respect to the input resistor 72 and output resistor 74, so as to not affect their performance. For the preferred embodiment of the present invention, the value of the tuning voltage resistance 76 is approximately 10,000 ohms.

The resulting electronically variable delay line circuit, that is, the variable delay line 40' having capacitive, inductive, and resistive elements, is similar to a tuned low-pass filter. The filter is tuned to a particular frequency by changing the corner frequency which, for the present embodiment is approximately 700 or 800 MHz. As the corner frequency of the filter is altered, the delay characteristics of the filter changes.

The electronically variable delay line apparatus eliminates electrical characteristic tolerances associated with commercially available electronic components, such as cables, state devices, and connectors, used in the apparatus design, while also correcting for aging rates of the components, which change over time.

Although a preferred embodiment of the invention has been described, it is to be understood that other configurations and element values may be used, depending on the application, without deviating from the inventive concepts set forth herein. For example, the eight varactor configuration described was chosen because it met the requirements for a particular application. Theoretically, there is no limit as to the number of varactors which can be employed. However, as the number of varactors increase, the individual varactor capacitance is reduced to a point where the individual capacitance values are so small as to approach the capacitance characteristics of a continuously distributed delay line. Such an embodiment is intended by the inventors and, as such, is an important contribution to the delay line art.

It will therefore be apparent to those skilled in the art that various changes and modifications in the specifically described embodiments can be carried out without departing from the scope of the invention which is to be limited only by the scope of the appended claims.

We claim:

1. A variable delay line configured for propagating signals with an electronically adjustable delay characteristic comprising:
   a signal conductor;
   a ground reference conductor;
   a variable-capacitance varactor coupled between said ground conductor and said signal conductor;
   means for adjusting the capacitance of said varactor to thereby vary said delay characteristic of said delay line; and
   impedance optimizing resistive means coupled between said signal conductor and said ground conductor for terminating said delay line and minimizing multiple reflections of said signals over the range of said delay characteristic of said delay line, wherein said impedance optimizing resistive means includes an input resistance coupled across an input end of said delay line and an output resistance coupled across an output end of said delay line, and wherein said input resistance and said output resistance are substantially different.

2. The variable delay line of claim 1 wherein said means for adjusting the capacitance of said varactor includes changing the biasing voltage of said varactor.

3. A variable delay line having input and output ends, and having an electronically adjustable delay characteristic and a characteristic impedance that varies between a minimum impedance and a maximum impedance depending upon said adjusted delay characteristic, said variable delay line comprising:

conducting path means for propagating signals between said input and said output ends of said delay line;

variable reactance means coupled to said conducting path means for changing said delay characteristic of said delay line in response to a control signal applied to said reactance means; and a first resistance coupled to said conducting path means at said input end and a second resistance coupled to said conducting path means at said output end, said first resistance and said second resistance terminating said conducting path means to minimize multiple reflections of said signals propagating through said conducting path means, wherein said signals are largely absorbed at said input end or said output end after a single reflection when said characteristic impedance of said delay line is at said minimum impedance or said maximum impedance and wherein said signals are partly absorbed at each end so as to largely absorb them after two reflections when said characteristic impedance of said delay line varies between said minimum impedance and said maximum impedance.

4. The apparatus of claim 3 wherein said conducting path means includes a printed circuit signal conductor and a ground reference conductor.

5. The apparatus of claim 4 wherein said variable reactance means includes a varactor diode coupled between said printed circuit signal conductor and said ground reference conductor.

6. The apparatus of claim 5 wherein said first resistance and said second resistance are coupled between said printed circuit signal conductor and said ground reference conductor.

7. A variable delay line having a first end and a second end and configured for propagating signals to circuitry having a nominal characteristic impedance value, said variable delay line also having an electronically adjustable delay characteristic and a characteristic impedance that varies between a minimum impedance value and a maximum impedance value depending upon said adjusted delay characteristic, said variable delay line comprising:

a conducting path connected between said first end and said second end of said delay line;

variable capacitive means coupled to said conducting path for changing said delay characteristic of said variable delay line in response to a control signal applied to said capacitive means; and a first resistance coupled to said conducting path at said first end and having a value greater than said nominal characteristic impedance value, and a second resistance coupled to said conducting path at said second end and having a value less than said nominal characteristic impedance value, said resistances terminating said variable delay line to minimize multiple reflections of said signals propagating through said delay line, wherein said signals are largely absorbed at said first end or said second end after a single reflection when said characteristic impedance of said delay line is at said minimum impedance value or said maximum impedance value and wherein said signals are partly absorbed at each end so as to largely absorb them after two reflections when said characterstic impedance of said delay line varies between said minimum impedance value and said maximum impedance value.

8. The apparatus of claim 7 wherein said conducting path includes a printed circuit signal conductor and a ground reference conductor.

9. The apparatus of claim 7 wherein said variable capacitive means includes a varactor diode.

10. The apparatus of claim 7 wherein said first resistance is equal to said nominal impedance value multiplied by the square root of the ratio of said nominal impedance value to said minimum impedance value.

11. The apparatus of claim 10 wherein said second resistance is equal to said nominal impedance value multiplied by the square root of the ratio of said nominal impedance value to said maximum impedance value.

12. The apparatus of claim 8 wherein said variable capacitive means includes a varactor diode coupled between said printed circuit signal conductor and said ground reference conductor.

13. The apparatus of claim 12 wherein said first resistance and said second resistance are coupled between said printed circuit signal conductor and said ground reference conductor.

* * * * *